US007865851B2

(12) United States Patent
Gurney

(10) Patent No.: US 7,865,851 B2
(45) Date of Patent: Jan. 4, 2011

(54) CAPACITANCE EXTRACTION OF INTERGRATED CIRCUITS WITH FLOATING FILL

(75) Inventor: David J. Gurney, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 572 days.

(21) Appl. No.: 11/369,565

(22) Filed: Mar. 6, 2006

(65) Prior Publication Data
US 2007/0220459 A1 Sep. 20, 2007

(51) Int. Cl.
G06F 17/50 (2006.01)
G06F 9/45 (2006.01)

(52) U.S. Cl. .................. 716/5; 716/1; 716/2; 716/4; 716/10; 716/12

(58) Field of Classification Search .................. 716/2, 716/5, 10, 12; 257/773; 438/435, 622
See application file for complete search history.

(56) References Cited

U.S. PATENT DOCUMENTS

| 6,931,613 | B2 | 8/2005 | Kauth et al. | |
|---|---|---|---|---|
| 6,998,716 | B2 * | 2/2006 | Hung | 257/773 |
| 7,393,755 | B2 * | 7/2008 | Smith et al. | 438/435 |
| 2002/0116696 | A1 | 8/2002 | Suaya et al. | |
| 2002/0162082 | A1 * | 10/2002 | Cwynar et al. | 716/12 |
| 2006/0035456 | A1 * | 2/2006 | Ramakrishnan et al. | 438/622 |
| 2007/0214446 | A1 * | 9/2007 | Lavin et al. | 716/12 |

OTHER PUBLICATIONS

Kurokawa et al.; "Efficient capacitance extraction method for interconnects with dummy fills"; Oct. 3-6, 2004; Custom Integrated Circuits Conference, 2004. Proceedings of the IEEE 2004; pp. 485-488.*
Hua Xiang et al.; "Exact algorithms for coupling capacitance minimization by adding one metal layer"; Mar. 21-23, 2005; Quality of Electronic Design, 2005. ISQED 2005. Sixth International Symposium on; pp. 181-186.*
Nelson et al.; "Optimizing pattern fill for planarity and parasitic capacitance"; Dec. 10-12, 2003; Semiconductor Device Research Symposium, 2003 International; pp. 428-429.*
Lee et al.; "Investigation of the capacitance deviation due to metal-fills and the effective interconnect geometry modeling"; Mar. 24-26, 2003; Quality Electronic Design, 2003. Proceedings. Fourth International Symposium on; pp. 373-376.*
Nagaraj et al.; "Interconnect modeling for copper/low-k technologies"; 2004; VLSI Design, 2004. Proceedings. 17th International Conference on; pp. 425-427.*

* cited by examiner

*Primary Examiner*—Helen Rossoshek

(57) ABSTRACT

The present invention improves the accuracy of parasitic capacitance extraction of IC designs with floating fill. One embodiment of the present invention approximates the coupling capacitances of fill nets beyond an exact-approximation level by a fill net elimination method whereby actual capacitances of the fill net to the variable level are fully extracted and remaining capacitances are approximated.

11 Claims, 14 Drawing Sheets

$C_{1Gnd} = C_1 \times C_2 / (C_1 + C_2)$
$= C_1 - (C_1)^2 / (C_1 + C_2)$

ORIGINAL CIRCUIT

REDUCTION LEVEL, E = 1; FILL NETS APPROXIMATED

FILL NETS ELIMINATED $$\begin{array}{c} \phantom{S2}\;\;S2\;\;F1\;\;F2 \\ \begin{array}{c}S2\\F1\\F2\end{array}\begin{bmatrix} X & X & X \\ - & A & 0 \\ - & - & A \end{bmatrix} \end{array} \quad \text{OR} \quad \begin{array}{c}S2\\F1\end{array}\begin{bmatrix} X & X \\ - & A \end{bmatrix} \;+\; \begin{array}{c}S2\\F2\end{array}\begin{bmatrix} X & X \\ - & A \end{bmatrix}$$

$E = 1$

KEY
A= Approximated
X= Exact

FIG. 8

$$\begin{array}{c} \phantom{S2}\;\;S2\;\;\;F1\;\;\;F2\;\;\;F3 \\ \begin{array}{c}S2\\F1\\F2\\F3\end{array}\begin{bmatrix} X & X & X & 0 \\ & X & X & X \\ & & A & 0 \\ & & & A \end{bmatrix} \end{array}$$

$E = 2$

KEY
A= Approximated
X= Exact

FIG. 9

$$\begin{bmatrix} C11 & -C12 & 0 \\ -C12 & C22 & -C23 \\ 0 & -C23 & C33 \end{bmatrix} \begin{bmatrix} V1 \\ V2 \\ V3 \end{bmatrix} = \begin{bmatrix} Q1 \\ 0 \\ 0 \end{bmatrix}$$

C11 = C12 + C10; C22 = C12 + C23 + C30; C33 - C23 + C30

VIRTUAL FILL

CAPACITANCE EXTRACTION OF INTERGRATED CIRCUITS WITH FLOATING FILL

BACKGROUND

In many instances, an integrated circuit does not perform as initially designed and anticipated due to coupling capacitances. Consequently, accurate calculations of coupling capacitances play an increasingly important role in the IC design process. One reference, U.S. Pat. No. 6,931,613 issued to Kauth et al. on 16 Aug. 2005 titled "Hierarchical Feature Extraction for Electrical Interaction Calculation", recognizes this need to accurately model the multiple capacitances between circuit elements and describes a method of calculating the electrical interactions in an integrated circuit. The referenced method recognizes that capacitances are potentially created between circuit elements due to their area and physical proximity to other each other. Also, absent an intervening element, each element in the circuit has a plate capacitance between it and the substrate, which can be modeled as a capacitor connected between the lower surface of the element and the substrate. Additionally, the vertical edges of the element create fringe capacitances between the element and the substrate, which models as a capacitor connected between one edge of the element and the substrate. Further, crossover capacitances occur between a given circuit element on one layer and another circuit element on another layer of the chip. Thus, the circuit element additionally has a crossover plate capacitance and a crossover fringe capacitance. Finally, the circuit element has a near body capacitance between it and a neighboring element on the same or different layer.

The need to accurately determine the capacitances extends beyond circuit elements and includes interconnects between elements in an integrated circuit. U.S. Pat. Application No. 2002/0116696 by Suaya et al. titled "Capacitance and Transmission Line Measurements for an Integrated Circuit" describes a method and apparatus for determining the capacitances of wires in and IC. Further, as IC designs move further into submicron and nano-scale sizes with increasing element density, the capacitance coupling effect becomes more and more significant. And, therefore, accurate modeling of these interactions becomes increasingly more important.

Also, the submicron and nano-scale drive places increasing demand on improved fabrication processes. In one such fabrication process discrete blocks of fill—typically aluminum or copper metal tiles—are added to a layer to improve planarity of the chemical-mechanical polishing process before a subsequent layer is added. The fill floats in the substrate layer and is not connected to a power supply, nor is fill physically connected to signal paths. Nevertheless, these conductive blocks of fill add unintended parasitic capacitance to the IC.

Fill material refers to the collection of individual, electrically isolated metal tiles. And, each individual fill tile, in turn, is referred to as a fill net. The fill nets are structurally and electrically different than the signal nets referred to herein. As a result of the strategic placement of fill added during fabrication, capacitance coupling occurs beyond element-to-element or signal paths (also called signal nets) and includes coupling capacitance to the floating fill nets. Yet, because this floating fill is metal, it influences the circuit performance. Specifically, the fill creates coupling capacitances with the signal nets and with other pieces of fill. And, as IC designs become increasingly dense, the capacitive coupling effects of the fill become a greater influence on IC performance.

Traditional tools for layout parameter extraction of resistances and capacitances at nodes within the IC design include CALIBRE® xRC brand extraction tool available from Mentor Graphics, and other tools available from Synopsys and Cadence, for example. These tools typically extract capacitances and resistance values and back-annotate the data to a circuit simulation that re-simulates the design to ensure the physical aspects of the design will not cause failure and to ensure it meets its function and or performance parameters. Extracting capacitances refers to a calculation determining the inherent capacitance values of a signal net based on its geometry and relationship to its environment in a particular IC design. And, extracting coupling capacitances refers to a calculation determining the capacitance values between two nets, such as two signal nets, a signal net and a fill net, or between two fill nets.

One prior-art extraction method accounts all the capacitive couplings from signal nets to fill nets and from fill nets to fill nets and is represented, for example, in FIG. 19. This prior-art approach involves an exact reduction of each interaction to precisely calculate the effective grounded capacitances and the effective coupling capacitances for the signal nets. Gaussian elimination of the fill net rows in a capacitance matrix formulation is applied. However, this method is not well-suited to every imaginable IC design because as the density and quantity of signal nets in a given area increase, and as more floating fill nets increase, the number of possible interactions grows factorially—and this creates a practical ceiling based on available computational ability of processors.

To simplify this, the entire circuit of both signal nets and floating fill nets are not represented in a single matrix. Because signal nets stop the propagation of floating fill net effects, clusters of signal nets coupled by fill nets can be represented by a simpler matrix that can be solved for the effective intrinsic and coupling capacitance. Thus, theoretically, if all the clusters of nets were small, then this simpler matrix substitution could be implemented for an accurate extraction.

This approach assumes that fill is widely spaced and stacked in layers—resulting in few inter-coupled fill nets. In reality, however, the assumption of small cluster matrix representations is not always valid. Instead, fill tiles are often spaced closely enough that they interact in a capacitive-coupled, three-dimensional mesh. Such a mesh can have hundreds of thousands of fill nets or more that would need to be eliminated in the matrix—a task that is not pragmatically solvable.

In sum, traditional extraction methods cannot be applied to the ever-increasing complexity of modern IC designs. As the number of circuit elements increase to meet market demand for smaller, more powerful IC designs, the coupling capacitance effect becomes more profound and, more importantly, the interaction effect grows factorially with the number of circuit elements. This factorial growth outpaces computational resources making this traditional method of extraction impossible. And, fabrication-improvement techniques, such as strategically placing fill material, further increases computational complexities due to coupling capacitances of fill-to-fill and fill-to-signal net interactions. Thus, the traditional method of exact extraction has reached a practical limit, and an accuracy limit.

Accordingly, there remains a need to determine the capacitance coupling effect. There is a need for an approximation method that reduces the computational complexity of coupling capacitances due to floating fill nets in an integrated circuit design. Moreover, the results of such an approximation method should enable subsequent analysis tools to optimize the IC design.

SUMMARY OF THE INVENTION

The present invention improves the accuracy of extraction in the presence of floating fill while maintaining reasonable extraction performance and netlist size. One embodiment of the present invention is a method to approximate the coupling capacitances of fill nets by assuming a grounding to a drain. A second method of the present invention includes a variable level reduction and fill net elimination method whereby actual capacitances of the fill net to the variable level are fully extracted and remaining capacitances are approximated. A third method of the present invention optimizes IC design by iteratively running either the first or second method to intelligently design the size and location of floating fill.

Further objectives of the present invention include:
Using of real fill-polygons as found in the design or virtual fill (implied fill described by fill placement rules);
Improving accuracy of prior-art "grounded fill" approach for RC extraction;
Creating small, manageable netlists;
Avoiding inclusion of floating nets in netlists;
Providing a method that applies to all floating nets or "fill nets";
Exceeding accuracies of prior-art RC extraction that ignore fill net capacitance effects;
Improving accuracy of the approximation of fill net capacitance effects that approaches full RC extraction;
Determining fill net capacitance effects in situations where full RC extraction with float nets is not feasible due to calculation time, resources, and overhead; and
Supporting extractions for RC, C, and RCC, for example.

Accordingly, the present invention presents methods and devices to achieve these objectives.

For example, in one embodiment the present invention includes a method for determining parasitic capacitances of layout data representing an integrated circuit design, the data including representations of a signal net and first and second fill nets, comprising extracting capacitances of the signal net; extracting coupling capacitances between the first fill net and the signal net; determining effective total capacitance of the first fill net by approximating a coupling capacitance between the first fill net and the second fill net; and determining the effective capacitance of the signal net. Further, the method includes generating a netlist.

One embellishment of this method includes decoupling of the first net from the second net according to a predetermined extraction approximation level. The predetermined extraction approximation level is selected by a user. Alternatively, the predetermined extraction approximation level varies based on an assigned characteristic of the signal net.

In another embellishment, fill characteristics, such as net aggregate capacitance characteristics are assumed to be similar to neighboring fill and, accordingly the second fill net aggregate capacitance characteristics are assumed to be equal to first fill net aggregate capacitance characteristics, or, alternatively, the second fill net includes a grounded capacitance.

Alternatively, approximating a coupling capacitance between the first fill net and the second fill net includes reading a coupling capacitance value from a look-up table.

Also, the method includes estimating a number of fill neighbors having a coupling capacitance effect on the signal net. This estimate, in one embodiment comprises inputting the number of fill neighbors by a user according to a description of fill topography, or by a pre-scan of the layout data according to a regional selection criteria.

Ideally, the method of the invention is adapted to run on a computer and, therefore, the method further comprises storing the effective capacitance of the signal net on a computer readable medium and storing the netlist on a computer readable medium.

In another embodiment, the present invention includes an improved design placement of fill in an existing IC design. Accordingly, the method comprises determining placement of fill in layout data representing an integrated circuit design, the data including an electronic representation of a signal net, comprising: inserting a first and second fill net according to a rule set; determining an effective capacitance of the signal net using a parasitic capacitance effect of the fill wherein a coupling capacitance between a first fill net and the signal net are extracted and wherein a coupling capacitance between the first fill net and a second fill net is approximated; and comparing the signal net effective capacitance to a target value. Once the target value and effective capacitance of the signal net are determined, the placement of the fill net or of the signal net, or both, can be adjusted to optimize or better approach the target value. Finally, the method includes generating an adjusted layout data representing the integrated circuit design with the adjusted signal net.

In yet another embodiment of the present invention, a method includes determining the parasitic capacitance effect of fill on layout data representing an integrated circuit design, the data including representations of a signal net, comprising: inserting an implied fill according to a rule set; introducing a series capacitance from the signal net through an added electrical node representing the fill and reducing the series capacitance to obtain the effective capacitance on the signal net; extracting capacitances of the signal net; extracting capacitances between the first fill and the signal net; and adjusting the signal capacitance to account for shielding by the fill. Finally, the method includes inserting a second fill and determining effective total capacitance of the first fill net by approximating a coupling capacitance between the first fill and the second fill.

DRAWING

FIG. 8 is a matrix reduction of the circuit of FIG. 5, setting a fill extraction level to 1 using a method according to the present invention.

FIG. 9 is a matrix reduction of the circuit of FIG. 5, setting a fill extraction level to 2 using a method according to the present invention.

DESCRIPTION OF THE INVENTION

Figure 1:
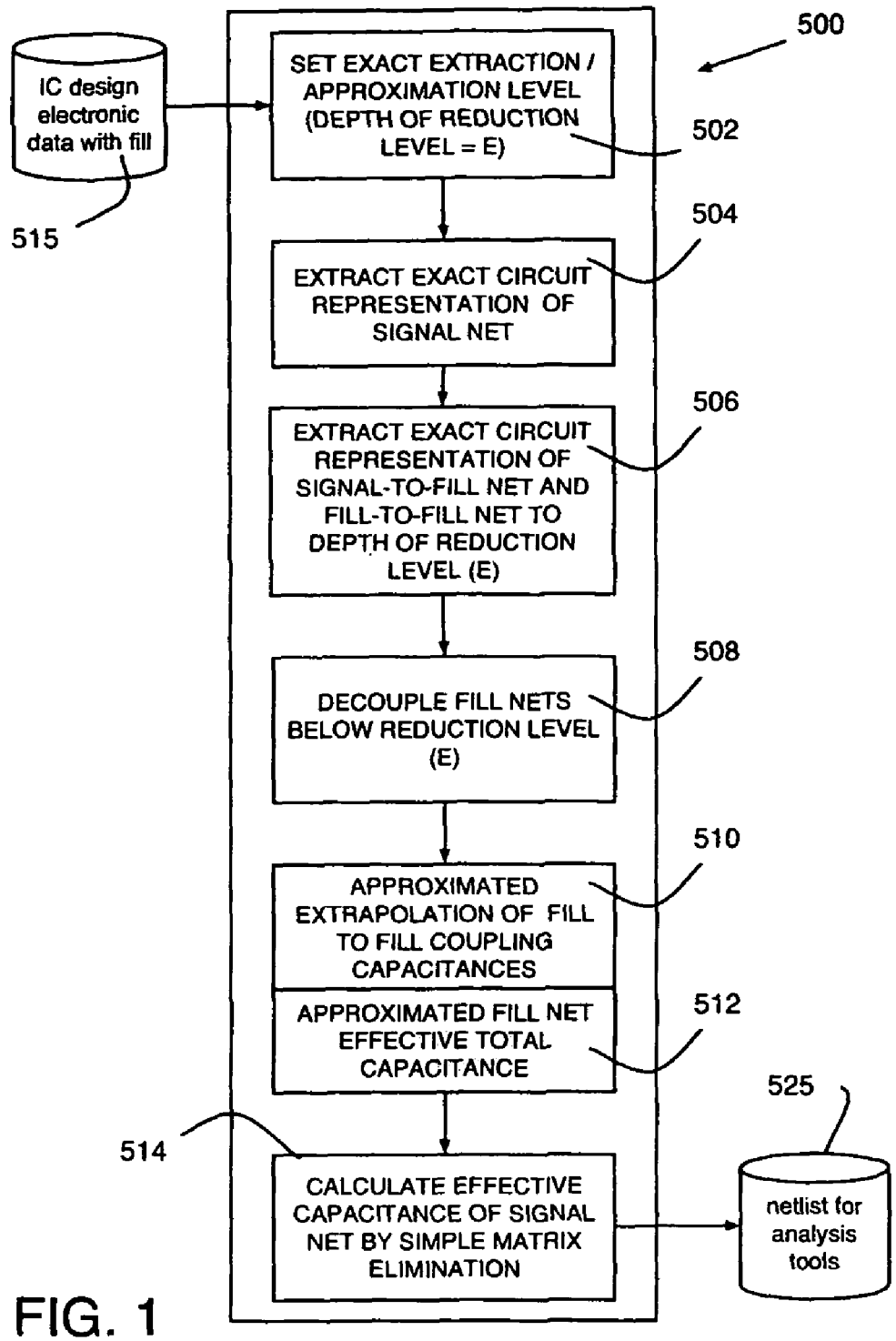
FIG. 1 is a flowchart showing a method according to one embodiment of the present invention.

The present invention, described herein and illustrated in the accompanying figures of the drawing, is portrayed through the use of exemplary embodiments that represent its spirit and scope. Further, in the various figures, certain components may be omitted to more clearly illustrate a particular aspect of the invention. And, those skilled in the art will appreciate that various combinations of elements, substitutions of elements, omissions and deletions of elements will not deviate from the spirit and intent of the present invention. The scope of the invention shall be limited only by the appropriate construction of the claims that follow.

Figure 20:
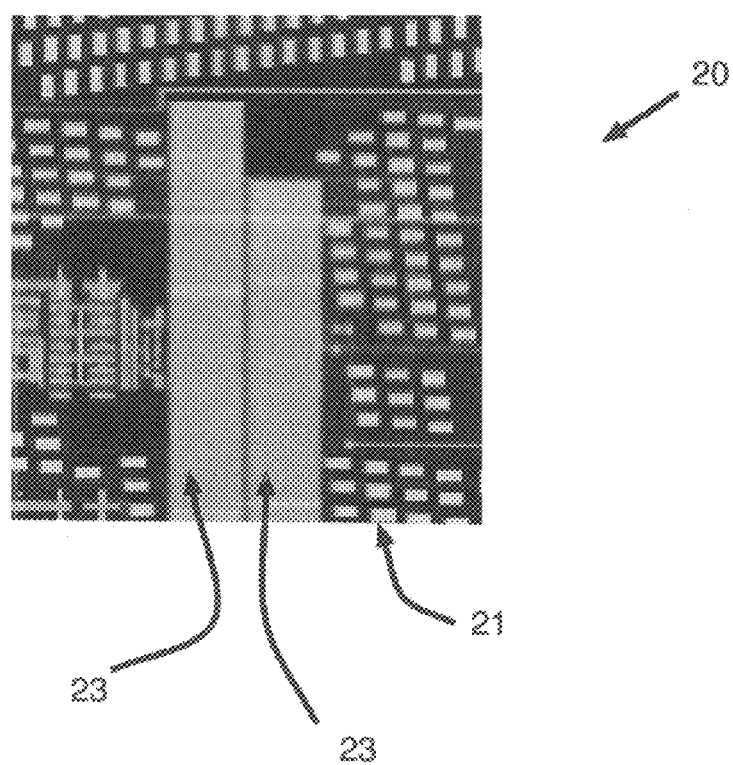
FIG. 20 is a layout diagram showing the relationship of fill to a signal net.

The present invention provides a method and apparatus for improving the accuracy of extraction for integrated circuits having floating fill nets. Modern IC designs include millions of metal tile that float (are electrically isolated) in the design, yet have a parasitic capacitance effect on signal nets. FIG. 20, for example, illustrates a portion of a physical layout of an IC design 20. Therein, signal nets 23 are surrounded by several tiles of fill 21. Accordingly, the extraction method and apparatus of the present invention, in one embodiment for example, is particularly suited to perform parasitic extractions during various stages of an integrated circuit design and fabrication process. More specifically, this invention is particularly suited in parasitic extractions that calculate the capacitance effect on floating fill nets, particularly for deep submicron circuits since floating fill net capacitance effects have quantifiable influence on signal net performance.

Briefly, FIG. 1, a block diagram, pictorially represents an overview of the present invention. In the representative embodiment of FIG. 1, the parasitic effects of floating fill in an integrated circuit, including the capacitive coupling effects on fill-to-fill and signal-to-fill interactions are determined.

The IC design—including signal nets and floating fill—represented in electronic data format (block 515) is provided to the extraction tool 500. The method includes receiving electronic data representing an integrated circuit with both signal nets and fill nets; selecting a first variable ("E", defined below) representing a level of full extraction (block 502); calculating by full extraction the capacitance coupling of signal nets (block 504); and fully extracting fill net capacitance coupling to signal nets and fill net to fill net capacitance coupling to the level represented by the first variable "E" (block 506); decoupling the fill net beyond the level represented by the first variable "E" (block 508); approximating the fill net capacitance coupling effect beyond the level represented by E (block 510); and calculating the effective capacitance of the fill net (block 512) on the signal nets using a series capacitance equation or by using a partial capacitance matrix elimination (block 514). Finally, the tool 500 provides a netlist in a data format suitable for use by common analysis tools (block 525).

Alternatively, the method of FIG. 1 includes approximating the effective and intrinsic coupling capacitances for a fill net beyond the level defined by the first variable "E" by assuming that the fill nets beyond the level defined by the first variable are grounded (not shown). And, in another embellishment, aggregate capacitance characteristics for a (second) fill net beyond the level defined by the first variable "E" are assumed to be the same as the aggregate capacitance characteristics of the first fill net.

Figure 19:
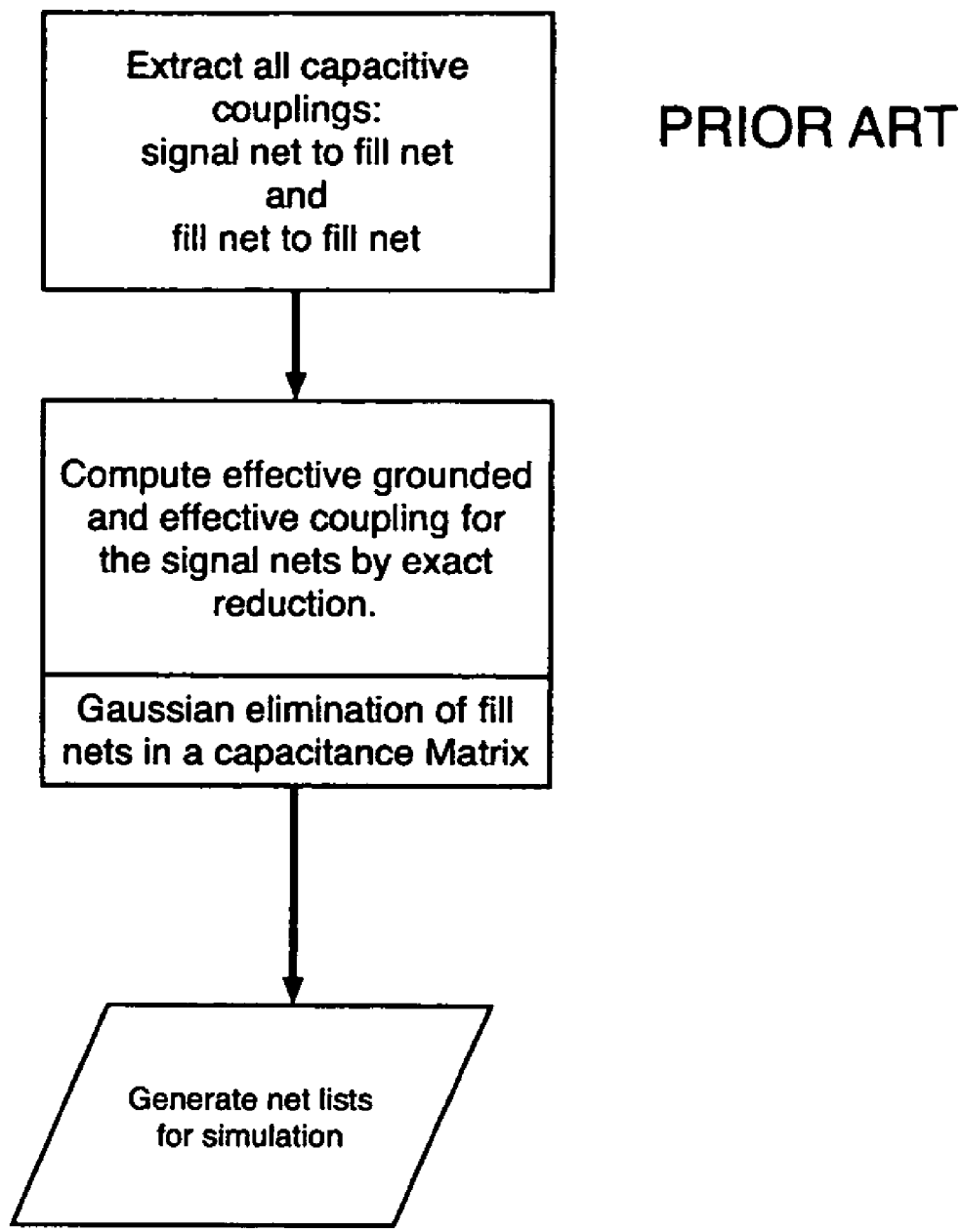
FIG. 19 is a block diagram showing one prior-art method for extracting coupling capacitances in an integrated circuit.

The prior-art method (for example, of FIG. 19) of exact reduction of the capacitive coupling effect of fill and signal net interaction is not possible as IC-designs increase element and floating fill net counts. However, in simpler IC-designs the prior-art exact reduction method works well. The computation of the effective capacitance for a signal net coupled to a fill net is simple once the effective total capacitance of the fill net ($C_{fEff}$) is known. The resulting effective intrinsic capacitance for the signal net in terms of the original coupling capacitance ($CC_{sf}$) is:

$$C_{sfEff} = CC_{sf} - (CC_{sf})^2 / C_{fEff} \quad \text{[equation 1]}.$$

This traditional approach rapidly consumes computational resources and reaches a practical limit as modern design drives toward higher net counts. Thus, there is a need to derive an accurate, yet fast approximation of effective total capacitance of the fill net ($C_{fEff}$). Additionally, as the IC design becomes more populated with signal and fill nets, and the increase in netlist size for noise (C) and signal integrity (RCC) extractions impose another limitation this computational intense approach: The elimination of fill nets coupled to (otherwise) uncoupled signal nets creates a new capacitive-coupling between other signal nets at a factorial growth rate. And, therefore, the prior-art method rapidly reaches a practical limit imposed by computational limits of modern processors.

To combat this practical limit of the prior-art teachings, the present invention provides an approximation method and an exact reduction method to quickly and accurately determine parasitic capacitances within the confines of modern processor capability.

Figure 2:
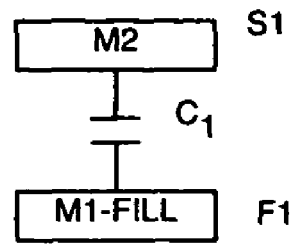
FIG. 2 is a diagram showing capacitance coupling between a signal net in metal-layer 2 and a fill net in metal-layer 1.
Figure 3:
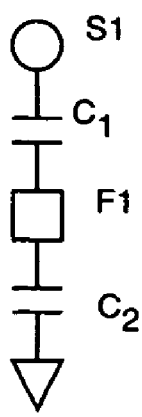
FIG. 3 is a circuit diagram of the circuit shown in FIG. 2.
Figure 4:
FIG. 4 is a reduced circuit diagram of the circuit of FIG. 3 after applying a method of the present invention.

FIG. 2 shows a physical representation of a simple circuit with a signal net (S1) located in the second metal layer, metal 2 (M2) of an integrated circuit. A piece of floating fill material, represented by F1, locates in metal-1 (M1). The stacked location of the fill F1 to signal net S1 creates a coupling capacitance (C1). FIG. 3 transforms the diagram of FIG. 2 into a circuit diagram, and adds the assumption that the floating fill F1 has intrinsic (grounded) capacitance C2. FIG. 4 shows the reduction calculation that eliminates the fill F1, replacing it and its associated capacitance-couplings, C1 and C2, with the ground capacitance, $C1_{Gnd}$, whereby:

$$C1_{Gnd} = (C1 \times C2) / \Sigma(C1 + C2) \quad \text{[Equation 2]}.$$

In this simple example, exact reduction of the effect of the fill net is readily calculated via full extraction.

Figure 5:
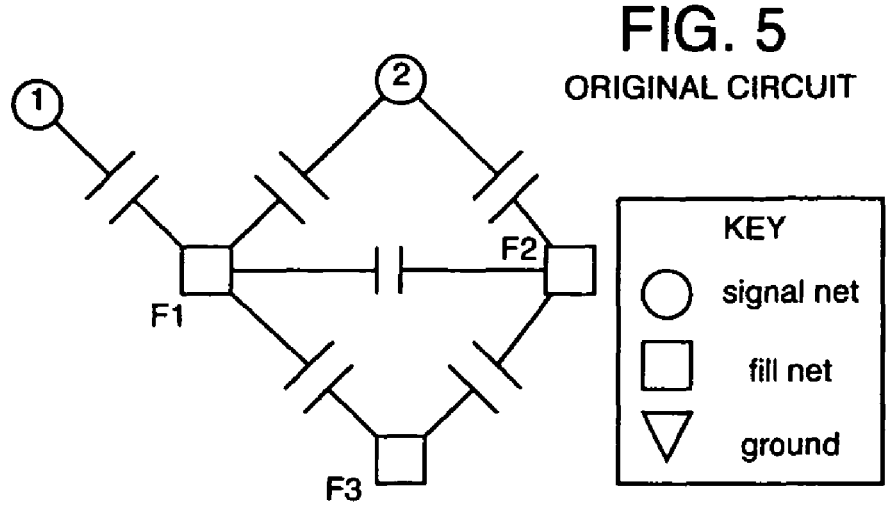
FIG. 5 is a diagram of a circuit with fill nets.

However, as integrated circuit designs become more complex, for example as shown in FIG. 5, the parasitic effects of capacitance coupling on the signal nets due to fill nets increases in computational complexity. FIG. 5 shows a simple, original circuit having uncoupled signal nets (represented by circles in the figure). The signal nets are capacitance-coupled to floating fill nets (represented by squares in the figure). Additionally, each fill net is capacitance-coupled to neighboring fill nets.

Figure 6:
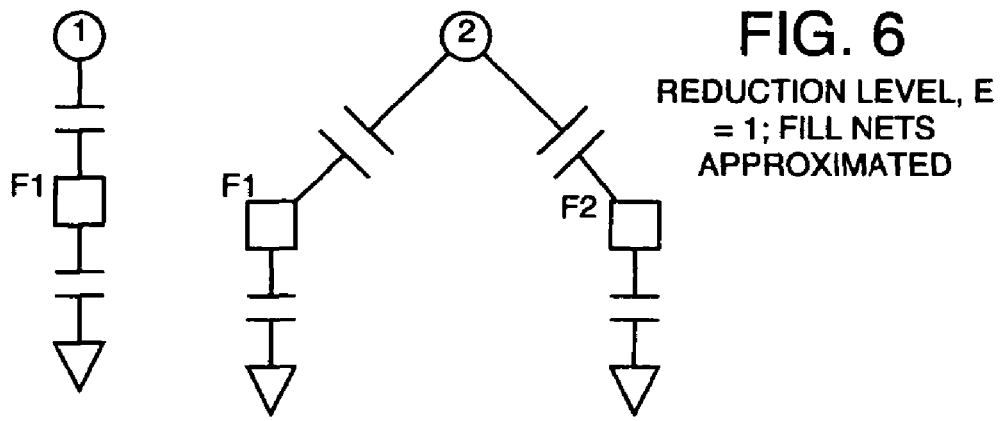
FIG. 6 is a circuit diagram showing grounded capacitance of a first generation fill net approximation of the circuit of FIG. 5 using a method according to one embodiment of the present invention.

FIG. 6 shows an approximation of the effective capacitance-coupled fill nets by assuming that the floating fill nets beyond the first level are grounded and, therefore, the effective capacitance of the floating fill net is assumed to be the same as the total capacitance of the floating fill net. This, alternatively, is expressed as the sum of the intrinsic capacitance of the given fill net ($C_{f0}$) plus the sum of all the coupling capacitances for all fill nets coupled to the given fill net:

$$C_{\mathit{ffeff}} = C_{\mathit{ff}} = C_{f0} + \Sigma_i CC_{fi} \qquad \text{[Equation 3]}.$$

Figure 7:
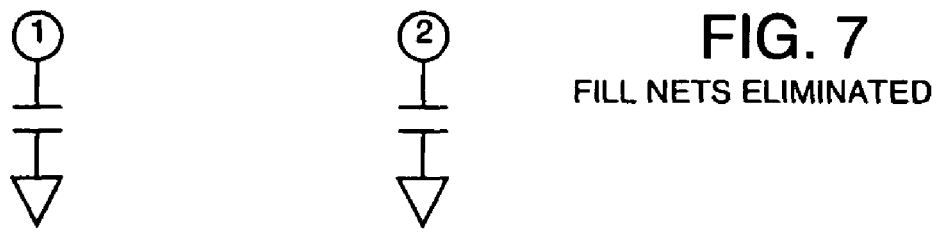
FIG. 7 is a diagram of the circuit of FIG. 6 with the fill nets eliminated using a method according to one embodiment of the present invention.

FIG. 7 shows the final reduction of the original circuit of FIG. 5 whereby the fill nets are eliminated and, instead, are replaced by a capacitance determined by the signal to fill net capacitance ($C_{sf}$) minus the square of the signal to fill net capacitance ($C_{sf}^2$) divided by the effective fill net capacitance ($C_{\mathit{ffEff}}$). Consequently, this approximation method simplifies parasitic extraction calculations for complex integrated circuit designs by reducing and eliminating the fill nets by replacing the fill nets with an effective fill net capacitance beyond a layer of full extraction.

The fill extraction level, defined herein by the variable "E", specifies the maximum number of coupling capacitors traversed in the shortest path from a signal net to a fill net. Thus all fill nets with a path length from a signal net less than E are fully extracted including fill to fill capacitance couplings and are included in a matrix where they will be eliminated in solving for the effect on the signal net. Capacitances to fill nets with path length greater than E are decoupled and the effect on the fill nets at path length equal to E is approximated. In one embodiment, the fill extraction level E is set to a predetermined value (for example E=1). However, it is understood that the fill extraction level (E) could be set to any level, (for example E=2) constrained only by the computational limits of the processor and time available.

In another embodiment of the present invention, an intelligent algorithm allows a user-selected critical path signal net to drive capacitance extraction. Along the critical path, E is set to a greater level than for the non-critical path signal nets.

Alternatively, the fill extraction level (E) is user-selected to a particular value for a given signal net of interest and to a different fill extraction level (E') for other signal nets in the same design. Another alternative is to set the fill extraction level E to different values for different logical blocks in the design.

FIGS. 8 and 9 illustrate the matrix reduction for a simple circuit using the approximation method of the present invention wherein the fill extraction level (E) is set to 1 and 2, respectively. Using Signal 2 (S2) as an example, FIG. 8 uses the approximation reduction extraction method on the circuit illustrated in FIG. 5. By setting the fill extraction level to 1 (E=1), approximated capacitance values are inserted for all coupling beyond the first (E=1) level and exact (measured) capacitances are used for all elements (signal and fill) at or below the fill extraction level. The present method then reduces and eliminates the fill net by substituting individual signal net to fill net coupling-capacitance interactions by an effective capacitance, as will be more fully developed below. Accordingly, the intrinsic capacitance of S2 and the coupling capacitances of Signal 2 to Fill 1 (S2-F1) and Signal 2 to Fill 2 (S1-F2) are exact. And, the second order interactions are approximated. Alternatively, this matrix can be replaced by a pair of matrixes as shown in FIG. 8. Thus, in this example, on the order of two operations (per matrix) are needed to do the elimination.

FIG. 9, however, applies an exact reduction fill extraction level of 2 (E=2) of the same circuit of FIG. 5. This results in the 4×4 matrix, so on the order of eight operations are needed to do the elimination. In this example, exact coupling capacitances are determined to the second level, and all other interactions are approximated beyond this.

When the extraction level E is 1 the determination of the fill nets directly capacitance coupled to signal nets can be calculated during extraction. However, for fill extraction levels greater than E=1 some preprocessing may be desired to avoid complete extraction and storage of all fill-to-fill net coupling capacitances. The extraction engine is used to analyze the design and mark those fill nets that are at most path length E from a signal net by first, marking those fill nets directly coupled to signal nets as of path length 1. Then by iteration any unmarked fill net coupled to a fill net of path length p is marked as path length p+1. Once the fill nets are marked, the extraction proceeds in a manner of the invention (similar to that detailed for E=1). The exact capacitances including couplings are extracted for the signal nets and for the marked fill nets and these are entered in a matrix. The unmarked fill nets are decoupled and the effect of the unmarked fill nets on the fill nets at path length equal to E is approximated. The fill nets are eliminated from the matrix to compute the effective capacitance of the signal nets.

Figure 10:
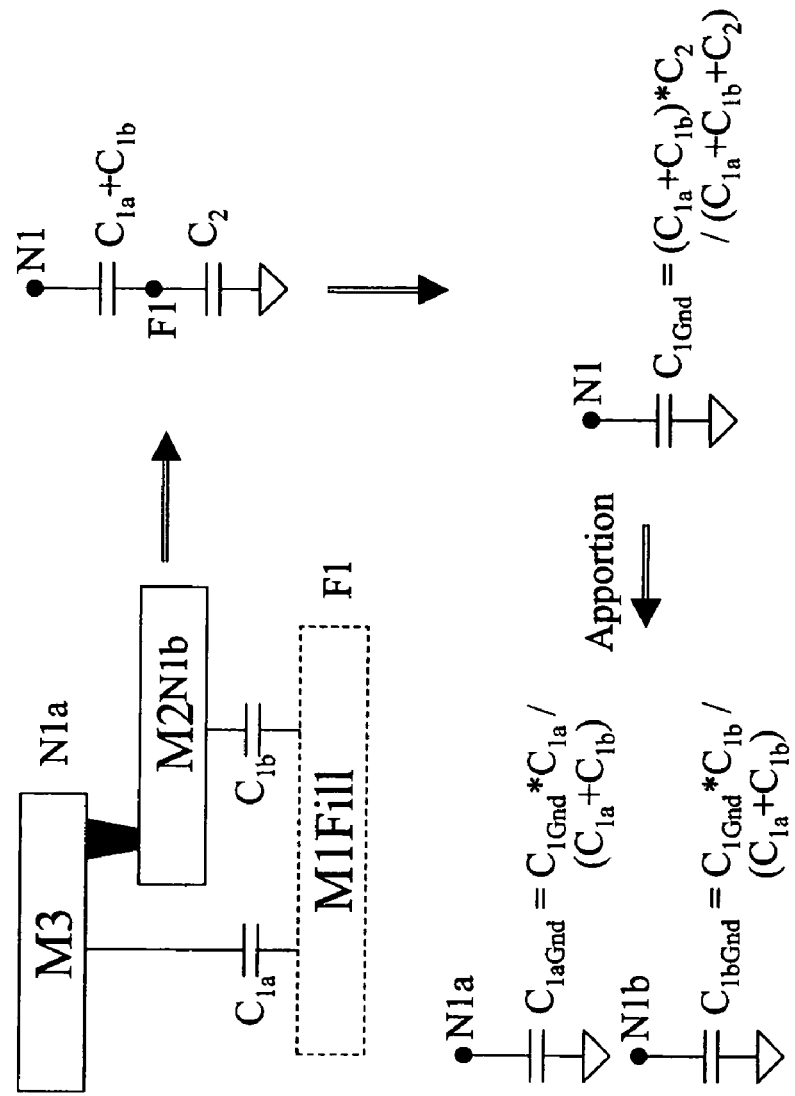
FIG. 10 is a diagram showing an exemplary capacitance-coupling model and subsequent reductions using an extraction method according to one embodiment of the present invention.

FIG. 10 shows a more elaborate circuit. However, the floating fill net reduction and elimination method according to one embodiment of the present invention applies equally well in this more complex example. Here, a coupled signal net (S1) resides in two layers on the chip, a first portion (S1a) locates in Metal-3 (M3), and a second portion (S1b) locates in Metal-2 (M2). And, the floating fill net (F1) locates in a third layer, in this example it is located in Metal-1 (M1). Accordingly, two coupling capacitances between the fill (F1) and the signal net (S1) results: one for each layer of metal. This, however, may be represented by a signal net to fill net capacitance of C1a plus C1b. Again, the fill net is assumed to be grounded past the fill extraction level E: This capacitance is represented by C2. Similar to above the effective signal to fill capacitance is computed, but in this case using the total C1a plus C1b. Then, the total effective signal capacitance is apportioned to the original two parts of the signal net.

A key component to maintaining good performance of the solution is to avoid extraction and dynamic storage of the fill-to-fill coupling capacitances. In contrast, it is relatively inexpensive to keep some amount of information about each fill net. Accordingly, in one step of a method of the present invention, the total capacitance ($C_{\mathit{ff}}$) and the total intrinsic capacitance ($C_{f0}$) are stored for each fill net (f). The total intrinsic capacitance includes fill net to signal net capacitance. Then, the total capacitance coupling of the given fill net to other fill nets is expressed as:

$$\Sigma CC_f = C_{\mathit{ff}} - C_{f0} \qquad \text{[Equation 4]}.$$

In one embodiment, the method and apparatus of the present invention recognizes that floating fill tends to appear in repeated, somewhat regular topologies that enable certain assumptions including that neighboring fill nets share similar characteristics. Therefore, when computing the effective grounded capacitance of a fill net (f) at level E—beyond which the fill-to-fill couplings are not retained, the invention assumes that a fill net beyond E (g) has the same values of $C_{\mathit{ff}}$ and $C_{f0}$. Also, is it reasonable to assume that each signal net is coupled to fill nets that act independently. From this assumption the last step of the calculation of the effective capacitance of the signal net when fill extraction level E=1 was given in equation 1, restated here:

$$C_{sfEff} = CC_{sf} - (CC_{sf})^2/C_{ffEff} \quad \text{[equation 1, restated].}$$

Applied for each fill net (f) coupled to the signal net. Thus, the goal for E=1 is to obtain accurate estimates of the effective grounded capacitance $C_{ffEff}$ of the fill net (f) from the limited information stored about each such fill net. Using the assumption of regular topology it is reasonable to extrapolate that the characteristics of fill net (f) apply to its fill net neighbors (g). In a matrix elimination the value $C_{ffEff}$ results when all the other fill nets have been eliminated. To compute $C_{ffEff}$ from its fill net neighbors it is not correct to use equation 1 above with f replaced by g and s replaced by f since $C_{ggEff}$ would include the elimination of f. Therefore instead the approach is to approximate first what the intermediate matrix elimination results would be, where $C_{ggElim}$ is the result of eliminating all the fill nets from g, except f. The equation for $C_{ggElim}$ is:

$$C_{ggElim} = C_{gg} - (D-1) \times (CC_{gh})^2/C_{hhElim} \quad \text{[equation 5].}$$

Here the factor "D" has been introduced which is the number of dominant fill net neighbors of g. In Equation 5 factor D (the number of dominant fill net neighbors) is reduced by 1 to take out the coupling to f. This can be turned to a recurrence by assuming from the fill mesh that $C_{ggElim} = C_{hhElim}$. The factor D is also used to approximate $C_{gh}$ from the stored sum $\Sigma CC_g$. This factor D can be either gathered explicitly for each fill net, although this process would be expensive due to the computational overhead required, or estimated. Estimating is based on the observation that fill appears in repeated, somewhat regular topologies, and D is the same for much of the design. Then D can be estimated either by input from the designer or by pre-scanning the design to determine the topology. For widely spaced stacked fill the number of dominant fill neighbors is set to two (D=2), and for grids of fill the number of dominant fill neighbors is set from about four to about six (D=4 to 6). This estimate of dominant fill neighbors in a given IC design is referred to as being topology aware.

For example, in one embodiment of the present invention a method applies the assumption that D=2, i.e. a given fill net has two dominant fill net neighbors. Accordingly, the effect of any fill nets beyond the assumed two dominant neighbors is assumed negligible.

Figures 11, 12:
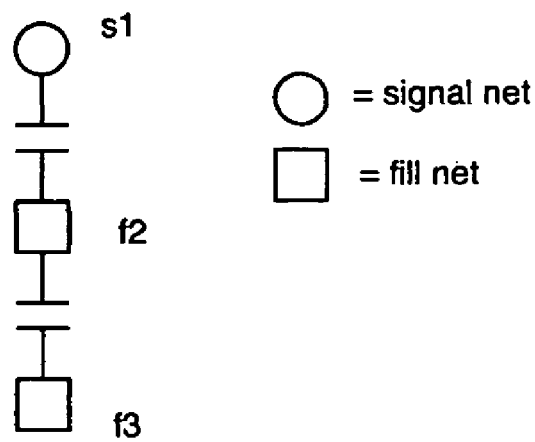
FIG. 11 is a circuit diagram showing capacitance coupling of a fill net to a signal net and a second fill net.
FIG. 12 is a matrix representation of the capacitance coupling of the circuit of FIG. 11.

Next, a method derivation proceeds by populating a capacitance matrix corresponding to the assumed topology, deriving a recurrence equation for the intermediate elimination terms ($C_{ggElim}$), and then solving for the recurrence convergence value. Returning now to FIG. 11, which shows an exemplary circuit with capacitance coupling of a signal net (s1) to a fill net (f2), and the fill net (f2) to a second fill net (f3), the signal net (s1) is located in one layer, and each fill net (f2, f3) are located on neighboring layers. And, FIG. 12 shows the matrix representation of the circuit in FIG. 11. To further this example, assuming that the fill topology is a linear chain as would exist in a stack of fill, the elimination of fill net j from fill net j+1 yields:

$$C_{j+1\,j+1\,Elim} = C_{j+1\,j+1} - (CC_{jj+1})^2/C_{jjElim}. \quad \text{[Equation 6].}$$

Approximating the coupling capacitance between fill net j and fill net j+1 ($CC_{jj+1}$) by assuming that there are only D=2 neighboring fill nets and with the same capacitance values of the given fill nets results in each fill net j and j+1 having a capacitance coupling of $\Sigma CC_j/2$. This assumption yields the recurrence:

$$C_{ffElim\,j+1} = C_{ff+1} - (D-1) \times (\Sigma CC_f/D)^2/C_{ffElim\,j}. \quad \text{[Equation 7].}$$

Then, assuming that $C_{j+1\,j+1\,Elim} = C_{jjElim}$ the equation is solved for the converged value. The resulting quadratic can then be solved for the general capacitance of the eliminated fill net ($C_{jjElim}$).

With this solution in hand, the next calculation determines the effective total capacitance of the fill net ($C_{ffEff}$) at level E, which is required to determine the effective capacitance for the signal net. Still assuming the present linear chain example, the effective total capacitance of the fill net is expressed as:

$$C_{ffEff} = C_{ff} - D \times (\Sigma CC_f/D)^2/C_{ggElim}. \quad \text{[Equation 8].}$$

Again, the factor "D=2" (above, Equation 8) results from the assumption that the given or target net has two neighbors. So, there are two final eliminations of neighboring nets. Because this assumption may not apply at each end of a linear chain, a preferred algorithm adjusts to include a first step of computing the effective total capacitance of the fill net assuming one neighbor (D=1):

$$C_{ffEff} = C_{ff} - D \times (\Sigma CC_f/D)^2/C_{ggElim} \quad \text{[Equation 9].}$$

However, if the above results in the erroneous result of $C_{ffEff}$ less than $C_{f0}$, then D is set to 2 and Equation 9 is re-evaluated.

This methodology provides good results for differentiating end nets from middle nets in a stack. In an embellishment to this above methodology, it is desirable to smooth the transition of the number of dominant neighbors (D) from a value of 1 (D=1) to a second value of 2 (D=2). One technique includes normalizing the effective total capacitance of the fill net: ($C_{ffEff} - C_{f0}$)/$C_{ff}$. Then, the dominant-neighbor factor D is sloped from D=2 to D=1 by applying a +/−10% increment.

The final step adjusts the coupling capacitance from a signal net to a fill net ($CC_{sf}$) by determining a value that will be added to the intrinsic capacitance or the signal net. Finally, the calculation:

$$C_{sfEff} = CC_{sf} - (CC_{sf})^2/C_{ffEff} \quad \text{[Equation 10];}$$

is performed and the result is added to capacitance of the signal net.

In another embellishment to the method according to the present invention, a given signal net is fractured into sub-nets due to the nature of the extraction process. However, it is possible that the various sub-nets couple to a common fill net. In this case, improved accuracy occurs when the above calculations (Equation 10) include the total coupling capacitance signal to fill net ($CC_{sf}$) for the net. That is, the sums of the coupling capacitance from all the sub-nets of a net to a particular fill net. Then, instead of adding the result of the effective signal net capacitance ($C_{sfEff}$) to the intrinsic capacitance of the signal net ($C_{s0}$), the intrinsic capacitances of the sub-nets are apportioned in the ratio of the sub-net coupling capacitance signal to fill net divided by the total coupling capacitance of the fill net, or:

$$\text{(sub-net } CC_{sf}\text{)/(total } CC_{sf}\text{).} \quad \text{[Equation 11].}$$

An optional additional step of a method according to one embodiment of the present invention includes a user-definable approximation of the effect of fill nets on coupling. This approximation could be based on a previous run of the present method and could be manually entered by a user, or an optimization routine can automatically and recursively run the algorithms and methods of the present invention repeatedly to improve the design of the IC to perform as intended and expected by more-accurately modeling the effect of capacitive-coupling of the fill nets to the signal nets by parasitic extraction.

In this option, the effective capacitance of a signal-to-fill net is represented by the user-defined factor (K) to scale the coupling-capacitance of the signal-to-fill net, or: $CC_{sfEff}=K \times CC_{sf}$. This approximation works reasonably well as long as the ratio of the effective fill-to-fill capacitance to signal-to-fill coupling-capacitance is greater than about 5 to about 10, or: $C_{ffEff}/CC_{sf}>$approx. range (5-10).

In an alternative embodiment, the method according to the present invention includes a user-definable estimation of the fill-to-fill net effective capacitance ($C_{ffEff}$). Although this method is less intuitive to a user, the results would be more accurate. Again, the present invention contemplates a method incorporating an automated, recursive algorithm that iteratively improves the accuracy of the parasitic extraction.

In an alternative embodiment of the present invention, a method incorporates a pre-characterization of the fill-topology by generating an exact representation of the fill with the target topology, then performing a high accuracy extraction and calculation of the effective capacitance of the fill nets, for example, setting the variable E (level of exact extraction vs. approximation) to a relatively high value.

One method and apparatus of the present invention enables user-selectable methodologies to approximate full parasitic extraction of capacitance due to floating fill in an IC design. In this embodiment, a user controls certain parameters: For example, the user may select to (1) ignore coupling to floating nets—employing a traditional method, (2) select to ground floating nets, or (3) select couple to floating net—using the assumption according to the method of the present invention. The first option enables a quick and accurate estimation of the actual extraction value. The second option, provides a conservative result with slightly longer run times or more processor memory, or both. The third option applies the methodologies and algorithms of the present invention to calculate the effect of floating fill in a parasitic extraction, which results in a far more accurate estimation than the first option, but at a processing time and memory cost slightly beyond the second option.

Figure 13:
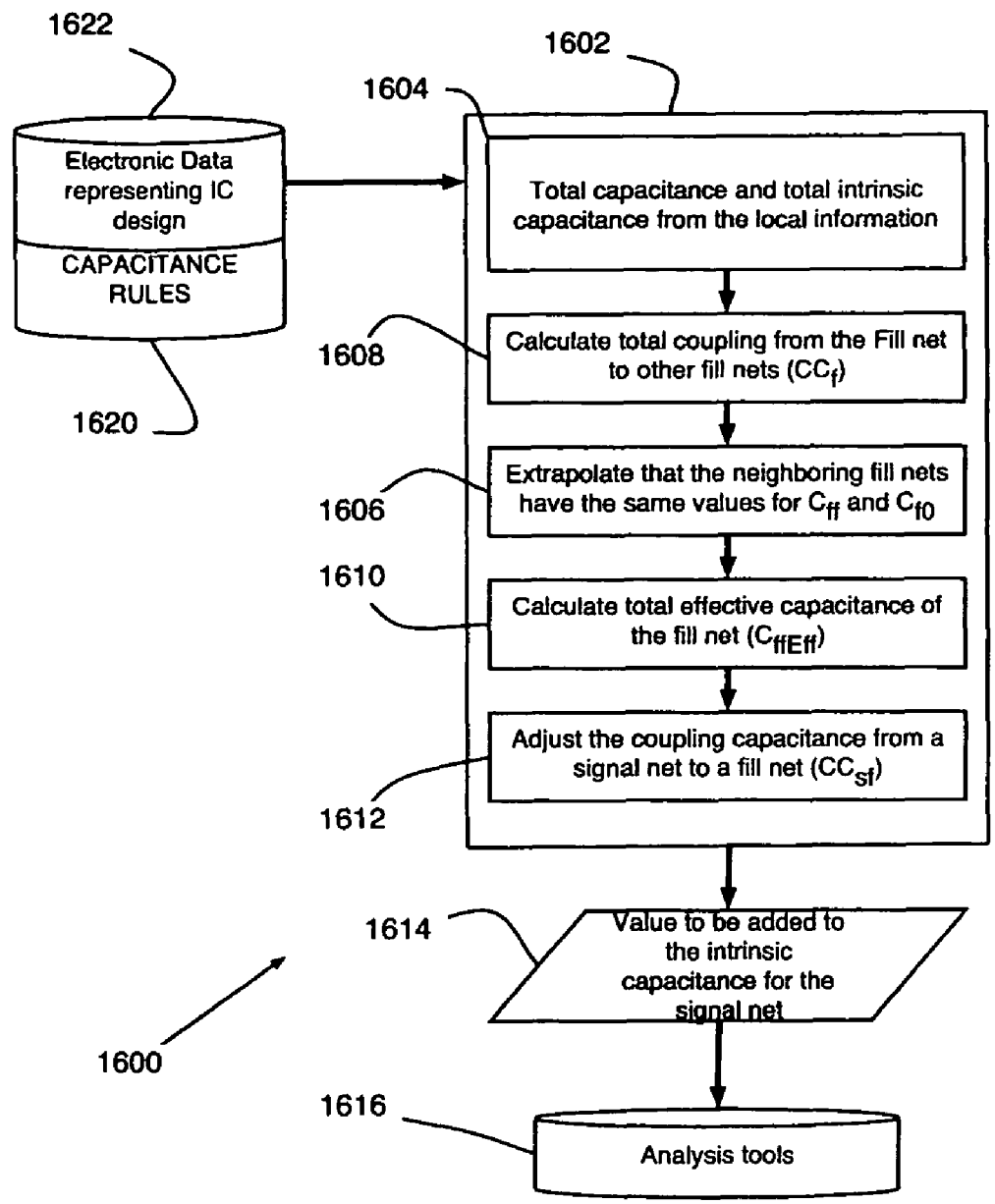
FIG. 13 is a block diagram showing a method of parasitic extraction of coupling capacitances according to a first embodiment of the present invention.

FIG. 13, a block diagram, represents a tool 1600 adapted for use on a computer. The tool uses electronic representations of an integrated circuit having capacitance coupling determined by a method (block 1602) of the present invention. Accordingly, the method includes reading or receiving electronic representation layout data (block 1622) of an integrated circuit design, the data includes an electronic representation of a signal net. Included with the signal net is a rule set (block 1620) that includes capacitance rules defining equations for calculating capacitance from layout geometries. The tool 1600 further includes data manipulated by the method 1602 including: local information of capacitances (block 1604); calculating total coupling capacitances from the fill net (block 1608); extrapolating capacitances of neighboring fill nets (block 1606); calculating total effective capacitance of the fill net (block 1610); adjusting the coupling capacitance from signal net to fill net (block 1612); determining the value to be added to the intrinsic capacitance for the signal net (block 1614); and exporting data, such as a netlist, for analysis tools (block 1616).

The method of FIG. 13, preferably, uses exact reduction of signal net capacitances and capacitances between the signal net and a first fill net and an approximation method according to the teachings of the present invention for a second fill net whereby the second fill net are decoupled if their path length is greater than the maximum number of coupling capacitors traversed in the shortest path from a signal net to a fill net (previously defined as E).

Figure 14:
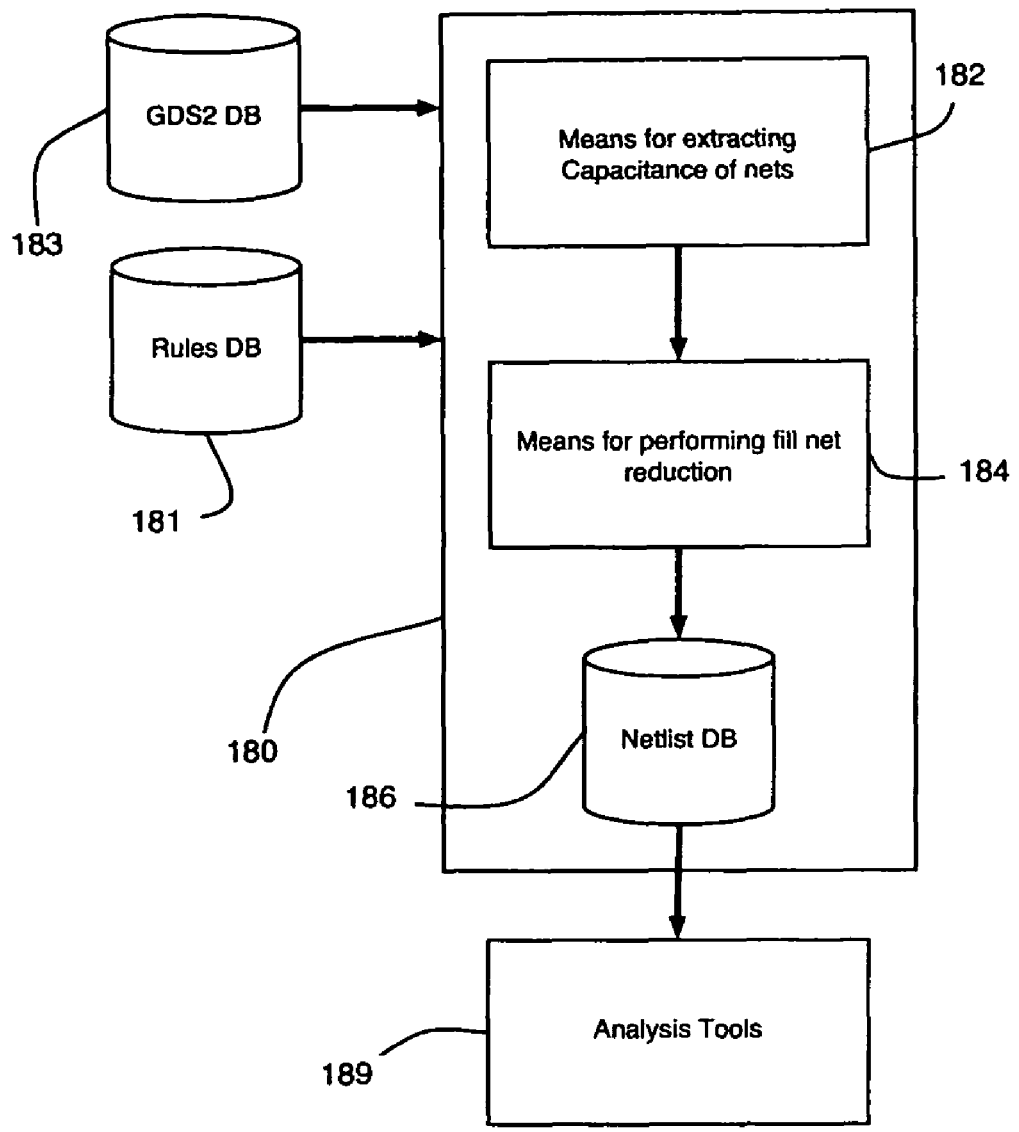
FIG. 14 is a block diagram showing one embodiment of the present invention in an application of use.

FIG. 14, a block diagram, shows one suitable application of the methods of the present invention. The capacitance extraction of an integrated circuit with floating fill method according to the present invention 180 includes means for extracting capacitance 182 of the various nets. Electronic data representing an integrated circuit is supplied by a database, such as a GDS2 database 183 and rules related to interactions, physical layout, layers, and such is provided by a rules database 181. Next, the means 182 further includes using the geometric data, including fill polygons, to determine actual capacitances of the signal nets and fill nets to a selectable and variable level. Fill net capacitances beyond the variable level value decoupled and approximated. Then, the coupling capacitances between signal-net-to-signal-net, signal-net-to-fill net, and fill net-to-fill net to the level determined by the selectable variable are calculated.

The method 180 further includes means for reducing the fill net 184. A suitable reduction technique includes Gaussian elimination of the fill net rows in a capacitance matrix formulation. However, preferably the method of block 180 includes determining parasitic capacitances according to the present invention and includes extracting capacitances of the signal net, extracting coupling capacitances between the first fill net and the signal net, determining effective total capacitance of the first fill net by approximating a coupling capacitance between the first fill net and the second fill net, and determining the effective capacitance of the signal net. Then, the resulting approximated and extracted capacitance coupling is outputted as a netlist in a format that can be utilized by a subsequent analysis tool 189.

Additional applications of the method and apparatus of the present invention include extensions to static timing (RC), noise (C), and signal integrity (RCC) designs. For example, fill placement can be optimized to adjust ground capacitance of signals, allow coupling through the fill to modify existing signal-to-signal coupling, or allow coupling through the fill net to create signal-to-signal coupling.

Figure 15:
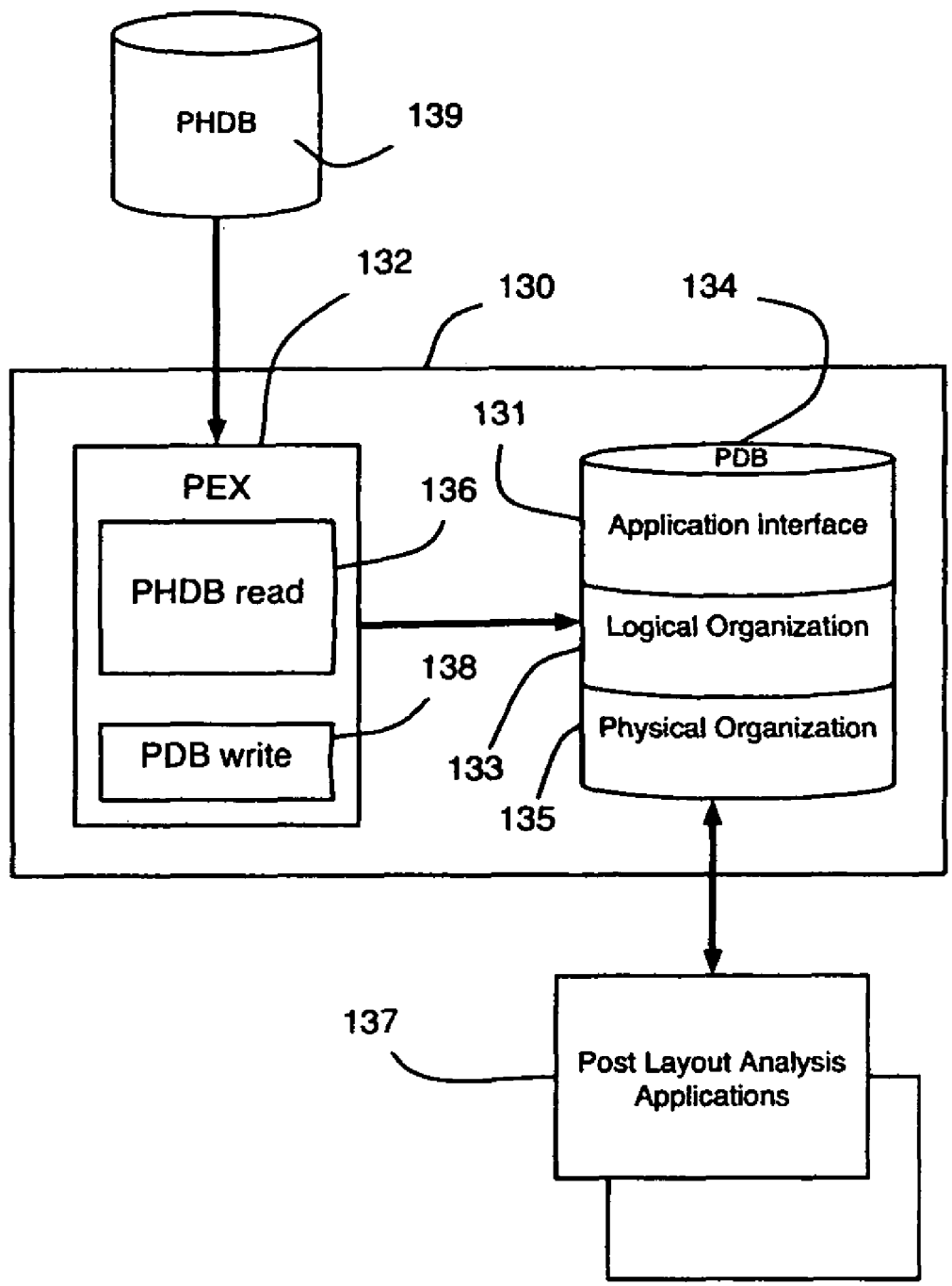
FIG. 15 is a block diagram showing a parasitic extraction tool according to one embodiment of the present invention.

FIG. 15, a block diagram, shows one embodiment of a parasitic extraction tool suitable for use with the present invention. Accordingly, the parasitic extraction tool (PEX) 132 generates electrical modeling data for layout nets of an IC design, such as, a deep sub-micron integrated circuit design, and stores the generated data in a parasitic database (PDB) 134. The data stored in PDB 134 is stored for subsequent use by client applications including post-layout analysis applications 137.

The parasitic extraction tool (PEX) 132 generates data corresponding to electrical modeling of layout nets using extracted connectivity, geometrical data of the layout nets, and capacitive modeling according to methods of the present invention. Extracted connectivity and geometrical data are stored in the Persistent Hierarchical Database (PHDB) (block 139) by layout cell hierarchies, and indexed by layout nets, for example. The PEX read function (PHDB Read) 136 enables retrieval of the connectivity and geometrical data of the layout nets from the PHDB 139. Further explanation of these interactions are well-documented, for example, in U.S. Pat. No. 6,934,669 to Suaya et al. entitled "Capacitance Measurements for an Integrated Circuit" issued on 23 Aug. 2005 and assigned to the present assignee (and, the entire reference is incorporated herein for all purposes).

The parasitic database (PDB) 134 accommodates a large volume of electrical modeling data and enables concurrent access by multiple client applications, typical of today's and future deep sub-micron IC designs and design environments. A representative organization of PDB 134 includes a physical organization database 135 adapted to enable storage of a sufficient quantity of electrical modeling data typical to this application, an application interface module 131, and a logical organization module 133 adapted to enable implementation of application interface 131.

The parasitic extraction tool (PEX) 132 includes a write function 138. A suitable write function 138 includes the write function as described in U.S. Pat. No. 6,249,903 entitled "Method and Apparatus for Generating and Maintaining Electrical Modeling Data for a Deep Sub-micron Integrated Circuit Design", assigned to the present assignee (and, this reference is incorporated herein for all purposes).

The parasitic extraction tool 132 and associated database 134 is adapted to run on a computer in the form of a computer program. The computer and computer program are represented by block 130 in FIG. 15.

Figure 16:
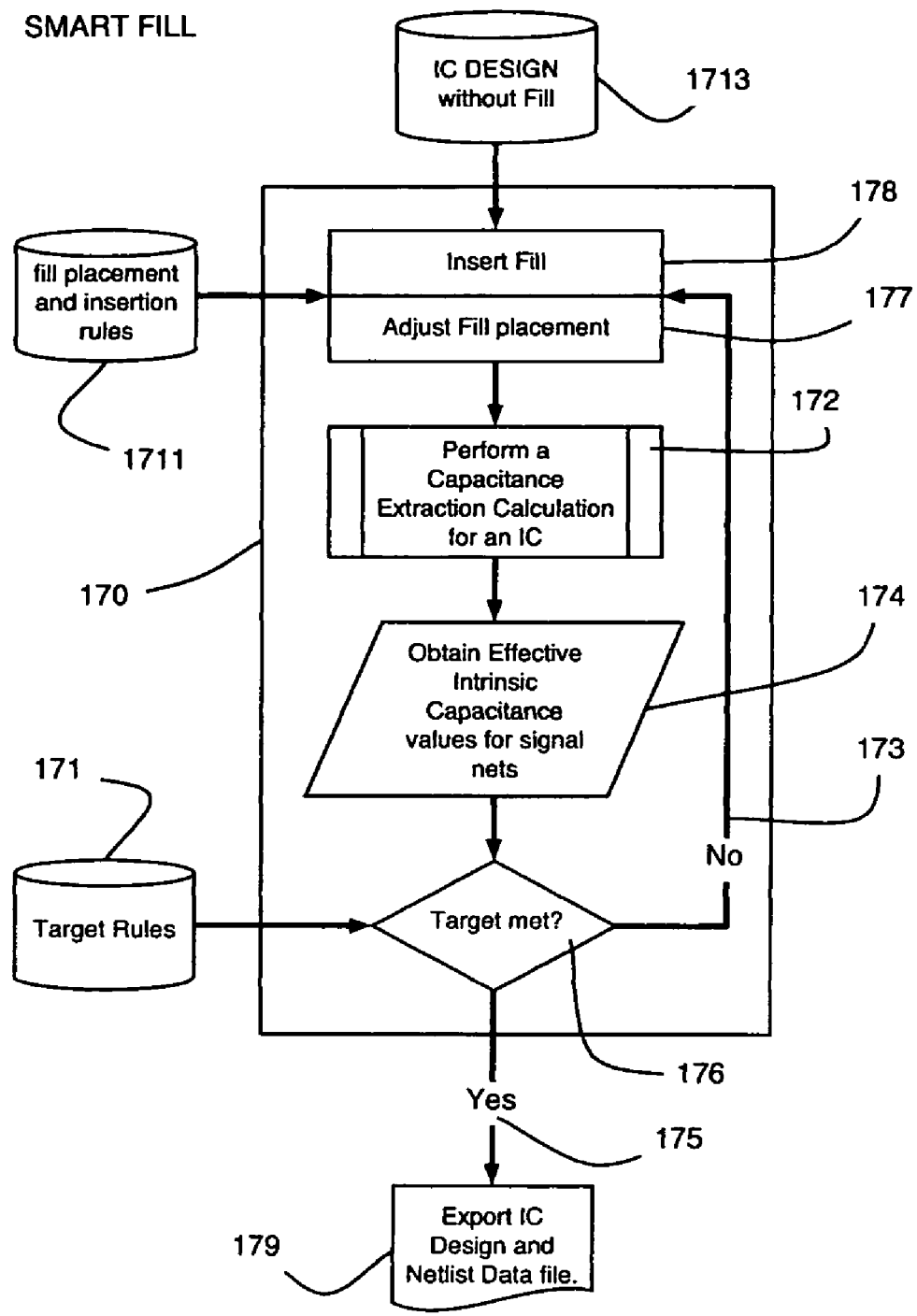
FIG. 16 is a block diagram showing an optimizing method of parasitic extraction of coupling capacitances according to a second embodiment of the present invention.

The methods of the present invention are well-suited to back-design integrated circuits by optimizing the physical size (geometry) and location (layer) of floating fill. FIG. 16, a block diagram, shows one suitable method of a iterative algorithm using the capacitance extraction methods of the present invention. The SmartFill™ brand feature, part of the DFM tools included with Calibre-brand design-to-silicon platform available from Mentor Graphics, Inc. of Wilsonville, Oreg., USA—assignee of this application. Such tools (represented generally by block 170) can be used to integrate parasitic capacitance data to optimize subsequent IC design iterations by utilizing fill coupling-capacitances to improve both planarity of layers and reduce parasitics.

The method of FIG. 16 enables determining the placement of individual file tiles (fill nets) in layout. The layout data representing an integrated circuit design (or a proposed IC design as represented by block 1713) having at least one signal net, the method comprises inserting a first and second fill net according to a rule set. The rule set (block 1711) is provided by the foundry and includes geometric data and electrical data of the file tiles to be placed and placement heuristics to optimize the fabrication process including chemical-mechanical polishing. Then, using a parasitic extraction method (block 172) such as the method described in FIG. 1, for example, determining an effective capacitance of the signal net. Preferably, the parasitic extraction method includes using a parasitic capacitance effect of the fill wherein a coupling capacitance between a first fill net and the signal net are extracted and wherein a coupling capacitance between the first fill net and a second fill net is approximated (block 174); and comparing the signal net effective capacitance to a target value (block 176). The target value can be set by the user, or may be pre-determined to minimize coupling capacitances of fill on a preferred signal net, or may be optimized by a heuristic that accounts for both fabrication parameters and targeted IC-design performance metrics.

Then, the method continues with determining the placement of fill by adjusting at least the first fill net according to the rule set using the comparison of the signal net effective capacitance to the target value. Alternatively, or in combination with adjusting the first fill net, the method includes adjusting the signal net according to the rule set using the comparison of the signal net effective capacitance to the target value. As the target value is attained within established tolerance parameters (lead line 175), an adjusted layout design is generated along with an (optional) netlist (block 179). The method recursively runs according to the target rules (block 171) and if the test condition is not met (lead line 173), the method is rerun, fill is re-inserted and/or the signal net is re-adjusted. If the absolute and relative change is beyond a pre-determined threshold, the locations of the fill in the neighborhood of those signal nets will be adjusted. The gradient of the capacitance changes are tracked to guide the adjustment on subsequent iterations (if needed).

Figure 17:
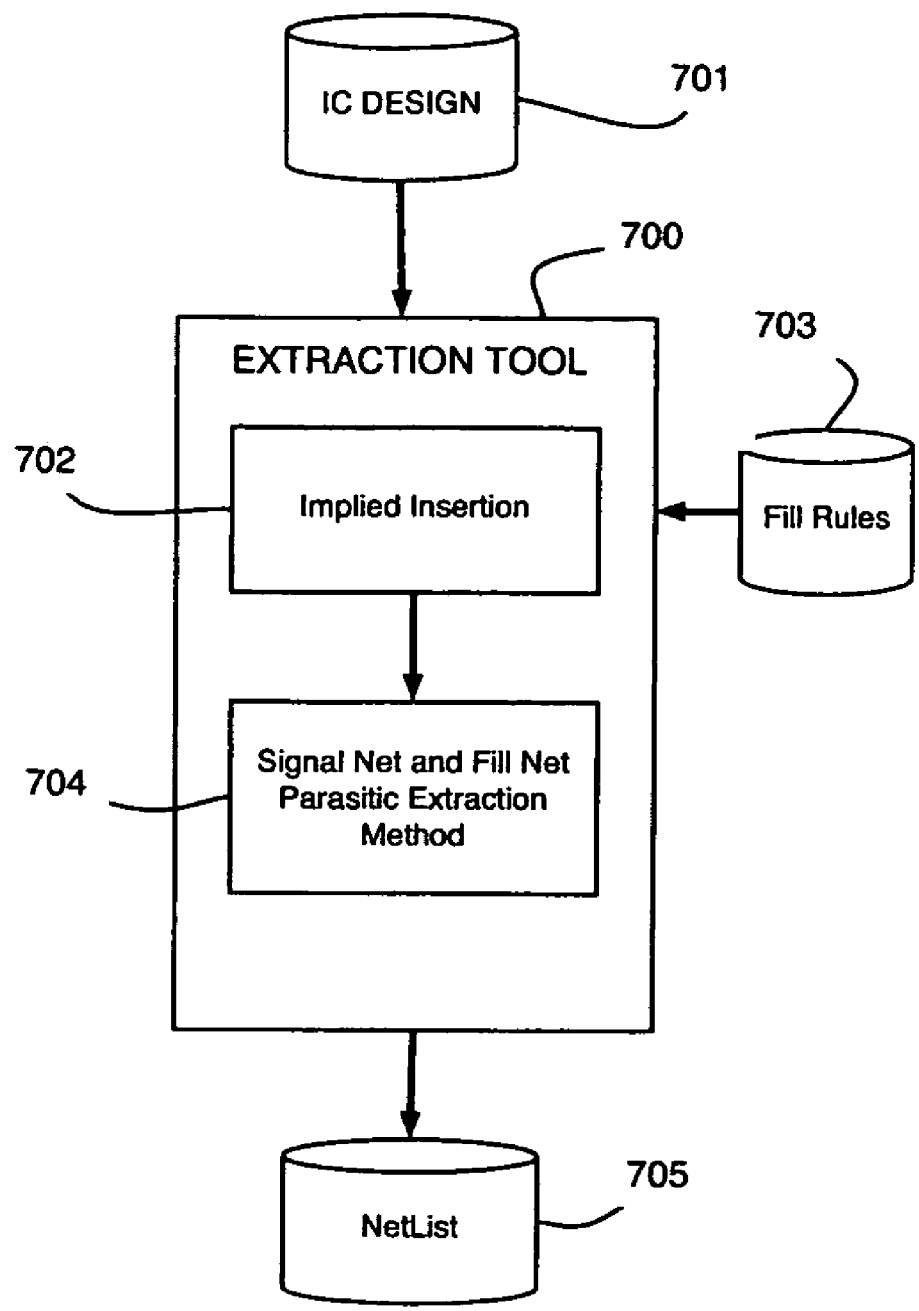
FIG. 17 is a block diagram showing an optimizing method of parasitic extraction of coupling capacitances according to a third embodiment of the present invention.

In some design flows it is advantageous to estimate the impact of the fill on the design without actually having added fill to the design database. The process of adding the fill is time consuming and can dramatically increase the design database size. Furthermore, in cases where the fill is added by the foundry the designer may not even see the design with fill to do a precise extraction and analysis. In these cases a VirtualFill™ extraction methodology can be applied. The VirtualFill™ feature of Calibre-xRC (available from Mentor Graphics) implicitly inserts fill in to a design during extraction to produce a netlist estimating the impact of the design as shown in FIG. 17. This implicit insertion can be considered a virtual placement of an abstraction of the physical fill tiles. Accordingly, in addition to the IC design, the tool is supplied a description of the fill that will be added later. Such a description includes area density, spacing and size of the fill tiles.

When extracting the capacitance of a signal net the tool assumes the presence of fill tiles with a probability proportional to the density. The tool also uses the calculation method of the invention to compute the effect of the fill on the signal nets. For example, assume that a signal net on Metal3 crosses over another on Metal1. In the region of the crossover there may be fill on Metal2.

The capacitance of the signal net is then the sum of the Metal3-Metal1 crossover where there is no fill (a scaling of 1−FillDensity is applied) plus the effect of the fill on the signal net where there is fill. Ideally, the effect of the fill on the signal net is determined by the exact/approximation parasitic capacitance coupling of the present invention wherein exact reduction to a pre-determined extraction approximation level (i.e. E=1), and an approximated effective capacitance for fill beyond the pre-determined extraction approximation level (i.e. E>1).

This virtual fill embellishment of the present invention proceeds in two parts (to adjust the capacitance calculations for the signal nets): 1) Introducing a series capacitance from the signal net through an added electrical node representing the fill and then reducing the series capacitance to get the effective capacitance on the signal net; and 2) Adjusting signal capacitance calculations to account for shielding by the fill. These two parts are applied to locations where fill may appear by scaling by a probability factor equal to the FillDensity. A probability factor of 1−FillDensity is used to compute the capacitance contribution for the corresponding non-fill area.

Figure 18:
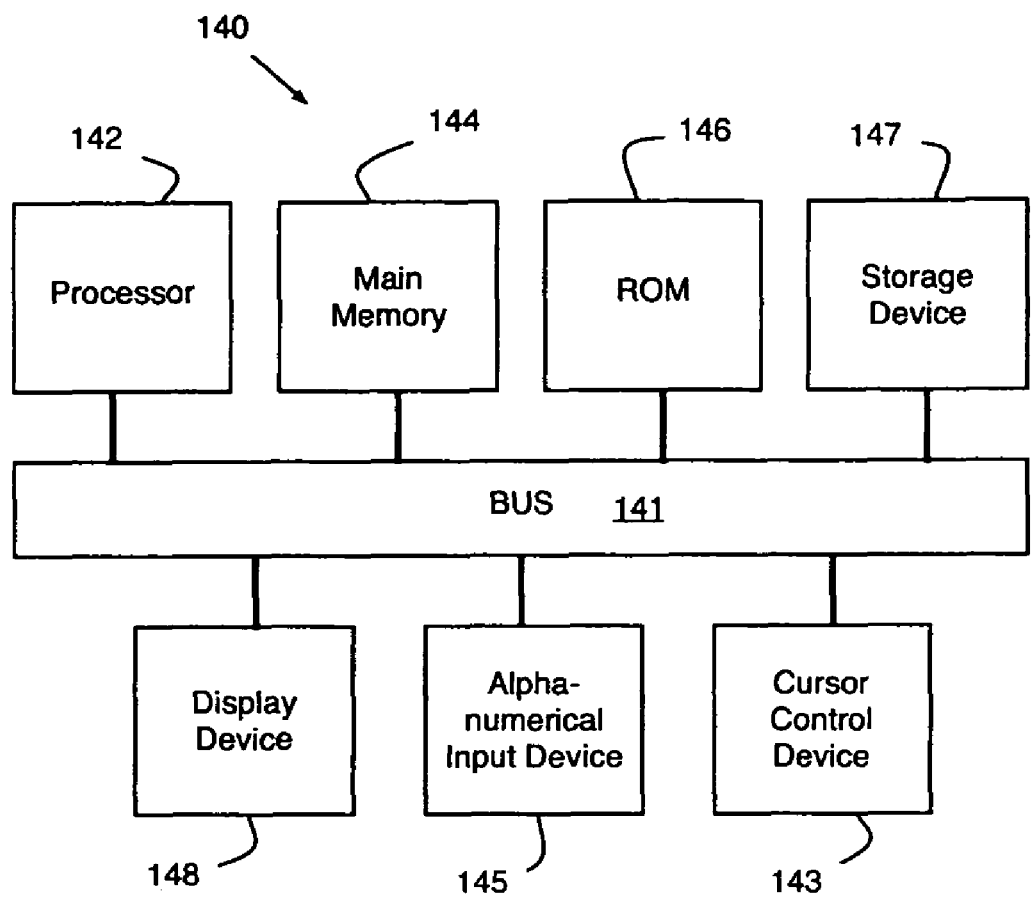
FIG. 18 is a block diagram showing one computer system suitable for use with one embodiment of the present invention.

FIG. 18 is one embodiment of a computer system and apparatus suitable for use with the present invention. The computer system and apparatus 140 adapts for use with the methods of the present invention including a parasitic extraction tool for approximating the coupling capacitance effect of fill nets on signal nets in deep sub-micron integrated circuit designs, for example. The computer system 140 includes a bus 141 or other communication device adapted to enable communication information and data to processor 142. Although shown with one processor 141, the computer system 140 can include multiple parallel or serial processors, or both. The computer system 140 further includes main memory 144, read-only memory (ROM) 146, a storage device 147, a display device 148, and input devices such as an alpha-numerical input device 145 and a cursor-control device 143, as would be understood in the art.

The method and apparatus of the present invention approximates the effective total capacitance of the fill net ($C_{f\!fE\!f\!f}$). And, although any approximation method introduces some error, application of this method results in improved accuracy over practical, traditional extraction methods for determining the capacitance effect of the floating-fill net. The method and apparatus of the present invention minimizes error by recognizing that the capacitive-coupling from signal net to fill net ($CC_{sf}$) is generally smaller than effective total capacitance of the fill net ($C_{fEff}$) and the error in the effective signal intrinsic capacitance ($C_{sEff}$) will be significantly less than the error in the approximation of the effective total capacitance of the fill net ($C_{fEff}$).

Performance analysis of the method according to the present invention included examining counts of capacitors in a test-case design. The test-case design contained 100,000 signal nets and 1,159,000 fill nets. The dominance of fill-to-fill capacitance coupling in the modified test-case design is illustrated by the counts of different types of capacitances as seen by the extraction engine, as shown here:

| | |
|---|---|
| Fill-to-Fill Capacitance: | 2730 M; (M = ×10$^6$); |
| Signal to Fill Capacitance: | 430 M; |
| Signal-to-Signal Capacitance: | 20 M; |
| Fill Intrinsic Capacitance: | 330 M; |
| Signal Intrinsic Capacitance: | 10 M. |

The method according to one embodiment of the present invention was used to extract the net capacitances in a test case containing floating metal fill. The results were compared to traditional methods. The first traditional method assumes that the fill is grounded. This method has good CPU time and memory use, but poor accuracy. The second is to fully extract the floating nets including all of the coupling capacitances and to then use a capacitance matrix Gaussian elimination to compute the effective capacitance of the signal nets. When extracting the full test case to assess performance the method according to the present invention added just 6% in CPU time on a workstation computer versus the first traditional method. In contrast the extraction portion of the second traditional method adds 498% without including the final matrix elimination which is not possible on a test case of this size. To illustrate the difficulty of the required matrix elimination, the netlist produced for analysis was compared among the different runs. The netlist produced by both the present invention's method and the first traditional method had the same number of nets: 4852, and the same number of capacitors to fill nets: 0. In the netlist produced by the extraction portion of the second traditional method there were 1,648,748 nets (i.e. 1,643,896 floating nets) and 6,546,503 capacitors to floating nets. Finally, to compare accuracy of the present invention's method a sample of nets were extracted using the three methods listed above. The second traditional method including the matrix elimination provides the baseline correct answer. The first traditional method showed relative errors of 10.1% in capacitance of the selected nets compared to the baseline, while the present invention's method the errors were 1.6%.

In many of the figures the same reference numeral is used to demonstrate the same or a similar component in different embodiments of the invention. Some figures omit features to more clearly demonstrate certain aspects of the present invention. The foregoing embodiments of the present invention are intended as representational examples and should not be construed as limiting.

I claim:

1. A computer implemented method for determining parasitic capacitances of layout data representing an integrated circuit design comprising:
   accessing by the computer an integrated circuit design, the integrated circuit design comprising a first fill net, a second fill net, and a signal net;
   extracting capacitances of the signal net;
   extracting coupling capacitances between the first fill net and the signal net;
   determining an effective capacitance of the first fill net by approximating a coupling capacitance between the first fill net and the second fill net;
   decoupling the first fill net from the second fill net according to a predetermined extraction approximation level selected by a user; and
   determining an effective total capacitance of the signal net, wherein the determined effective total capacitance of the signal net is based at least in part upon the extracted capacitances of the signal net, the extracted coupling capacitances between the first fill net and the signal net, and the determined effective capacitances of the first fill net.

2. The computer implemented method recited in claim 1, further comprising generating a netlist.

3. The computer implemented method recited in claim 2, further comprising storing the netlist on a computer readable medium.

4. The computer implemented method recited in claim 1, wherein the predetermined extraction approximation level varies based on an assigned characteristic of the signal net.

5. The computer implemented method recited in claim 1, further comprising setting the second fill net aggregate capacitance characteristics to be equal to the first fill net aggregate capacitance characteristics.

6. The computer implemented method recited in claim 1, wherein approximating a coupling capacitance between the first fill net and the second fill net comprises reading a coupling capacitance value from a look-up table.

7. The computer implemented method recited in claim 1, further comprising estimating a number of fill neighbors having a coupling capacitance effect on the signal net, wherein the determined effective total capacitance of the signal net is additionally based in part upon the estimated number of fill neighbors.

8. The computer implemented method recited in claim 7, wherein a user provides the estimate of the number of fill neighbors according to a fill topography description.

9. The computer implemented method recited in claim 7, further comprising determining the estimate of the number of fill neighbors by a pre-scan of the layout data according to a regional selection criteria.

10. The computer implemented method recited in claim 1, wherein the second fill net is assumed to be grounded.

11. The computer implemented method recited in claim 1, further comprising storing the determined effective total capacitance of the signal net on a computer readable medium.

* * * * *